United States Patent
Hu et al.

(10) Patent No.: US 12,376,418 B2
(45) Date of Patent: Jul. 29, 2025

(54) PHOTOELECTRIC DETECTOR

(71) Applicant: WUHAN OPTICAL VALLEY INFORMATION OPTOELECTRONICS INNOVATION CENTER CO., LTD, Hubei (CN)

(72) Inventors: Xiao Hu, Wuhan (CN); Xi Xiao, Wuhan (CN); Lei Wang, Wuhan (CN); Daigao Chen, Wuhan (CN); Yuguang Zhang, Wuhan (CN); Miaofeng Li, Wuhan (CN)

(73) Assignee: WUHAN OPTICAL VALLEY INFORMATION OPTOELECTRONICS INNOVATION CENTER CO., LTD, Hubei (CN)

( * ) Notice: Subject to any disclaimer, the term of this patent is extended or adjusted under 35 U.S.C. 154(b) by 651 days.

(21) Appl. No.: 17/789,934

(22) PCT Filed: Dec. 4, 2020

(86) PCT No.: PCT/CN2020/134067
§ 371 (c)(1),
(2) Date: Jun. 29, 2022

(87) PCT Pub. No.: WO2021/129356
PCT Pub. Date: Jul. 1, 2021

(65) Prior Publication Data
US 2023/0042376 A1   Feb. 9, 2023

(30) Foreign Application Priority Data

Dec. 27, 2019  (CN) .......................... 201911379861.4
Dec. 27, 2019  (CN) .......................... 201911382677.5
Dec. 27, 2019  (CN) .......................... 201911382842.7

(51) Int. Cl.
*H10F 77/40* (2025.01)
*G02B 6/125* (2006.01)
(Continued)

(52) U.S. Cl.
CPC ........... *H10F 77/413* (2025.01); *G02B 6/125* (2013.01); *G02B 6/2804* (2013.01);
(Continued)

(58) Field of Classification Search
None
See application file for complete search history.

(56) References Cited

U.S. PATENT DOCUMENTS 6,198,853 B1   3/2001   Yamada
8,861,909 B2   10/2014  Lipson
(Continued)

FOREIGN PATENT DOCUMENTS

CN   101088168 A   12/2007
CN   104752548 A   7/2015
(Continued)

OTHER PUBLICATIONS

Supplementary European Search Report in the European application No. 20906646.3, mailed on May 15, 2023. 14 pages.
(Continued)

*Primary Examiner* — Jerry Rahll
(74) *Attorney, Agent, or Firm* — Cooper Legal Group, LLC

(57) ABSTRACT

Provided is a photoelectric detector, comprising: a silicon layer (110), the silicon layer (110) comprising a first-doping-type doped region (111); a germanium layer (120) in contact with the silicon layer (110), the germanium layer (120) comprising a second-doping-type doped region (121); and a silicon nitride waveguide (130), the silicon nitride waveguide (130) being arranged surrounding the germanium
(Continued)

layer (120) along the extension directions of at least three side walls of the germanium layer (120), wherein the silicon nitride waveguide (130) is used for transmitting an optical signal and coupling the optical signal to the germanium layer (120), and the germanium layer (120) is used for detecting the optical signal and converting the optical signal into an electrical signal.

20 Claims, 8 Drawing Sheets

(51) Int. Cl.
  *G02B 6/28* (2006.01)
  *G02B 6/42* (2006.01)
  *H10F 30/223* (2025.01)
  *H10F 77/1226* (2025.01)

(52) U.S. Cl.
  CPC ......... *G02B 6/4206* (2013.01); *G02B 6/4295* (2013.01); *H10F 30/223* (2025.01); *H10F 77/1226* (2025.01)

(56) References Cited

U.S. PATENT DOCUMENTS

| | | | |
|---|---|---|---|
| 9,153,715 | B2 | 10/2015 | Lipson |
| 10,446,699 | B2 | 10/2019 | Bayn |
| 2002/0012115 | A1 | 1/2002 | Paritsky |
| 2005/0173712 | A1* | 8/2005 | Nakajima ............. H10F 77/147 257/E31.038 |
| 2012/0213468 | A1 | 8/2012 | Lipson |
| 2015/0129752 | A1 | 5/2015 | Lipson et al. |
| 2016/0124147 | A1 | 5/2016 | Chang |
| 2018/0212080 | A1* | 7/2018 | Meyer .................... G02B 6/124 |
| 2019/0035948 | A1 | 1/2019 | Bayn et al. |
| 2019/0129096 | A1 | 5/2019 | Mahgerefteh et al. |
| 2019/0195779 | A1* | 6/2019 | Boutami ............ G01N 21/3504 |
| 2019/0386159 | A1 | 12/2019 | Bayn et al. |
| 2019/0391006 | A1 | 12/2019 | Pelletier |

FOREIGN PATENT DOCUMENTS

| | | |
|---|---|---|
| CN | 105405911 A | 3/2016 |
| CN | 105655417 A | 6/2016 |
| CN | 105762220 A | 7/2016 |
| CN | 205723580 U | 11/2016 |
| CN | 107408589 A | 11/2017 |
| CN | 108292012 A | 7/2018 |
| CN | 109119500 A | 1/2019 |
| CN | 109148619 A | 1/2019 |
| CN | 109786497 A | 5/2019 |
| CN | 110379871 A | 10/2019 |
| CN | 111129168 A | 5/2020 |
| CN | 111129201 A | 5/2020 |
| CN | 111129202 A | 5/2020 |
| WO | 2012083862 A1 | 6/2012 |

OTHER PUBLICATIONS

International Search Report in the international application No. PCT/CN2020/134067, mailed on Feb. 25, 2021, 2 pgs.
English translation of the Written Opinion of the International Search Authority in the international application No. PCT/CN2020/134067, mailed on Feb. 25, 2021, 4 pgs.

* cited by examiner

PHOTOELECTRIC DETECTOR

CROSS-REFERENCE TO RELATED APPLICATION

The disclosure is based upon and claims priority to Chinese patent applications No. 201911379861.4, No. 201911382677.5 and No. 201911382842.7, filed on Dec. 27, 2019, the disclosures of which are hereby incorporated by reference in their entireties.

TECHNICAL FIELD

Embodiments of the disclosure relate to the technical field of photoelectric detectors, in particular to a photoelectric detector.

BACKGROUND

Silicon photonic technology is a new generation technology for the development and integration of optical devices, is based on silicon and silicon-based substrate materials (such as SiGe/Si and silicon on insulator), and uses an existing Complementary Metal Oxide Semiconductor (CMOS) technology. The silicon photonic technology combines the characteristics of ultra-large scale and ultra-high precision manufacturing of an integrated circuit technology with the advantages of ultra-high speed and ultra-low power consumption of a photonic technology, which is a subversive technology to cope with the failure of Moore's Law. This combination can reduce the cost due to the scalability of semiconductor wafer manufacturing. As one of the core devices of silicon photonic architecture, a photoelectric detector has the function of converting an optical signal to an electrical signal. However, an energy band structure of a crystalline silicon material causes that the detection efficiency thereof in an optical communication band is very low. Although Group III-V semiconductor materials are more suitable for photoelectric detector, the Group III-V semiconductor materials are incompatible with silicon technology and cannot be subjected to effective monolithic integration with silicon. Considering the compatibility of a germanium material with the CMOS technology, the technology of using the germanium material as the material of a light absorption layer to form a germanium-silicon photoelectric detector is proposed in the art. However, the current germanium-silicon photoelectric detector has the disadvantages of low responsivity and incapability of meeting the requirements of high light power detection, so further improvement is needed.

SUMMARY

In view of this, the embodiments of the disclosure provide an apparatus and method for generating pulse signals in order to solve at least one problem existing in a conventional art.

To achieve the above purpose, the technical solution of the embodiments of the disclosure is implemented as follows.

According to a first aspect, the embodiments of the application provide a photoelectric detector. The photoelectric detector includes: a Silicon (Si) layer including a first-doping-type doped region; a Germanium (Ge) layer in contact with the Si layer and including a second-doping-type doped region; and a silicon nitride waveguide arranged around the Ge layer in extension directions of at least three sidewalls of the Ge layer.

The silicon nitride waveguide is configured to transmit an optical signal and couple the optical signal to the Ge layer, and the Ge layer is configured to detect the optical signal and convert the optical signal into an electrical signal.

In an alternative embodiment, the silicon nitride waveguide includes a first waveguide region and a second waveguide region, and the Ge layer is arranged between the first waveguide region and the second waveguide region.

In an alternative embodiment, a projection of a sidewall of the Ge layer on the Si layer has a first shape with a length in a first direction greater than a length in a second direction.

The silicon nitride waveguide may further include a third waveguide region.

The third waveguide region connects the first waveguide region and the second waveguide region in the second direction.

In an alternative embodiment, a light splitting waveguide may further be included.

The light splitting waveguide connected to the silicon nitride waveguide is configured to split the received optical signal into at least two paths of optical signals, and output two paths of optical signals to the first waveguide region and the second waveguide region respectively.

In an alternative embodiment, the optical signal transmitted by the silicon nitride waveguide is propagated in a direction from the first waveguide region to the third waveguide region to the second waveguide region.

A distance between the first waveguide region and the Ge layer is larger than a distance between the second waveguide region and the Ge layer.

In an alternative embodiment, the silicon nitride waveguide and the light splitting waveguide enclose a closed area along the transmission direction of the optical signal, and the Ge layer is located in the closed area.

In an alternative embodiment, the silicon nitride waveguide includes a first waveguide layer and a second waveguide layer. The first waveguide layer includes a fourth waveguide region arranged above the Ge layer, and the second waveguide layer includes a first waveguide region, a second waveguide region and a third waveguide region arranged on a side face of the Ge layer.

The first waveguide layer and the second waveguide layer respectively couple the optical signal to the Ge layer through the fourth waveguide region and the first waveguide region, the second waveguide region and the third waveguide region.

In an alternative embodiment, the first waveguide layer further includes a first interlayer coupling region connected to the fourth waveguide region.

The second waveguide layer further includes a second interlayer coupling region connected to the first waveguide region and the second waveguide region.

Optical signal transmission is implemented between the first waveguide layer and the second waveguide layer through interlayer coupling of the first interlayer coupling region and the second interlayer coupling region. Optical signals of the first interlayer coupling region and the second interlayer coupling region are respectively transmitted to the fourth waveguide region, the first waveguide region, the second waveguide region and the third waveguide region.

In an alternative embodiment, the first waveguide layer is configured to receive the optical signal, and transmit, in the first interlayer coupling region, the received optical signal to the second interlayer coupling region of the second waveguide layer through interlayer coupling.

In an alternative embodiment, the distance between the first interlayer coupling region and the second interlayer coupling region is 50 nm to 1500 nm.

In an alternative embodiment, the cross-sectional area of the first interlayer coupling region becomes smaller and the cross-sectional area of the second interlayer coupling region becomes larger in the transmission direction of the optical signal.

In an alternative embodiment, an orthographic projection of the first interlayer coupling region on the Si layer is at least partially overlapped with an orthographic projection of the second interlayer coupling region on the Si layer.

In an optional embodiment, the second waveguide layer further includes a light splitting waveguide region located at the second interlayer coupling region and between the first waveguide region and the second waveguide region. The light splitting waveguide region is configured to split the optical signal transmitted from the second interlayer coupling region into at least two paths, and output two paths of optical signals to the first waveguide region and the second waveguide region respectively.

In an alternative embodiment, the first waveguide layer further includes an isolation waveguide region located between the first interlayer coupling region and the fourth waveguide region. An orthographic projection of the isolation waveguide region on the Si layer is staggered with an orthographic projection of the light splitting waveguide region on the Si layer, so that an optical signal of the first waveguide layer does not generate interlayer coupling with the second waveguide layer when transmitted to a position corresponding to the light splitting waveguide region.

In an alternative embodiment, the extension direction of the fourth waveguide region of the first waveguide layer is parallel to a contact plane of the Si layer and the Ge layer, and the distance between the fourth waveguide region and an upper surface of the Ge layer is 60 nm to 1000 nm.

In an alternative embodiment, the first waveguide region and the second waveguide region are straight waveguide regions.

The third waveguide region is a bent waveguide region.

In an alternative embodiment, the distance between the Ge layer and each of the first waveguide region and the second waveguide region is 50 nm to 1000 nm.

In an alternative embodiment, the extension direction of the silicon nitride waveguide is parallel to the contact plane of the Si layer and the Ge layer, and the distance between the silicon nitride waveguide and the Si layer is 100 nm-1200 nm.

In an alternative embodiment, the length of the Ge layer in the first direction is 5 µm to 100 µm.

In an alternative embodiment, a silicon dioxide material is arranged between the silicon nitride waveguide and the Ge layer.

A silicon dioxide material is arranged between the silicon nitride waveguide and the Si layer.

In an optional embodiment, the doped region of the first doping type and the doped region of the second doping type are respectively provided with a first metal electrode and a second metal electrode.

The first doping type is P-type, and the second doping type is N-type, so as to form a photoelectric detector with a PIN structure.

Alternatively, the first doping type is N-type, and the second doping type is P-type, so as to form a photoelectric detector with a NIP structure.

The embodiments of the disclosure provide a photoelectric detector including a Si layer, a Ge layer, and a silicon nitride waveguide. The Si layer includes a first-doping-type doped region. The Ge layer is in contact with the Si layer and includes a second-doping-type doped region. The silicon nitride waveguide is arranged around the Ge layer in the extension direction of at least three sidewalls of the Ge layer. The silicon nitride waveguide is configured to transmit an optical signal and couple the optical signal to the Ge layer, and the Ge layer is configured to detect the optical signal and convert the optical signal into an electrical signal. In the embodiments of the disclosure, the silicon nitride waveguide is formed by a silicon nitride material, and the silicon nitride waveguide is arranged around the Ge layer, so that the optical signal in the silicon nitride waveguide may be coupled with the Ge layer at least twice. Thus, not only can high optical power detection be implemented, but also the propagation loss of the optical signal is reduced, and the saturation absorption effect is avoided. Meanwhile, the responsivity of the detector can be improved without increasing the length of a coupling region (that is, the length of the Ge layer) of the detector.

DETAILED DESCRIPTION

Figure 1:
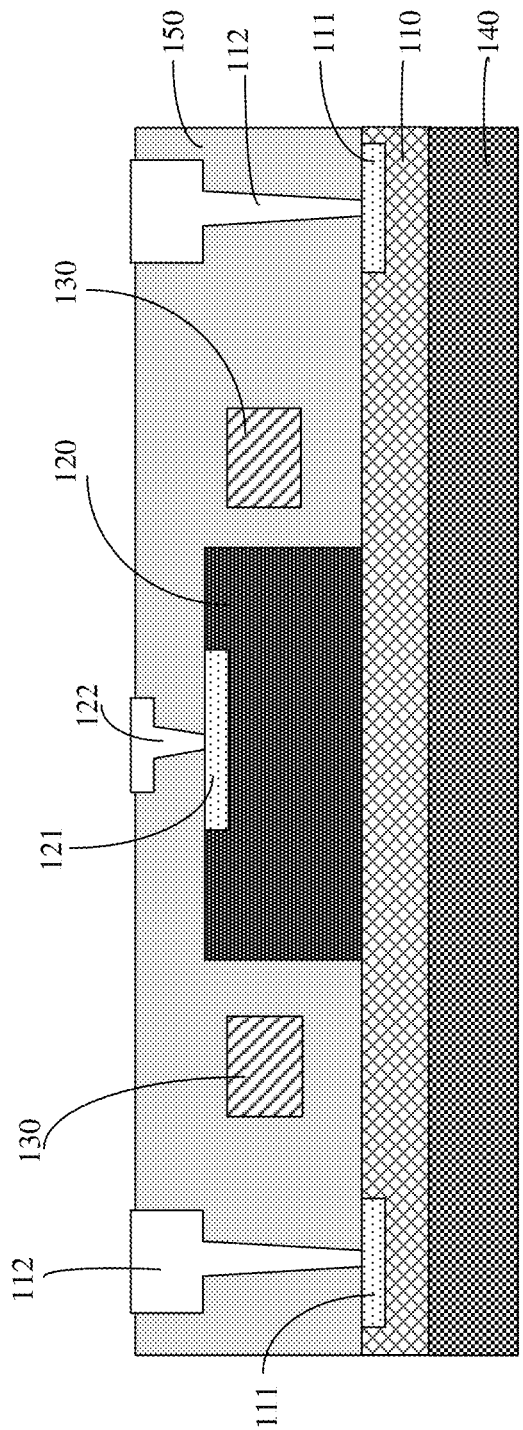
FIG. 1 shows a side sectional view of an example of a photoelectric detector according to an embodiment of the disclosure.

Exemplary embodiments disclosed by the disclosure will be described below more comprehensively with reference to the drawings. Although the exemplary embodiments of the disclosure are shown in the drawings, it should be understood that, the disclosure may be implemented in various forms and should not be limited by the specific embodiments described herein. On the contrary, these embodiments are provided for more fully understanding of the disclosure, and to completely convey a scope disclosed by the disclosure to a person skilled in the art.

In the following description, numerous specific details are given in order to provide a more thorough understanding of the disclosure. However, it is apparent to persons skilled in the art that the disclosure may be implemented without one or more of these details. In other examples, in order to avoid confusion with the disclosure, some technical features well known in the art are not described. That is, not all the features of the actual embodiments are described herein, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms "first", "second", "third" and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used herein, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In order to have a more detailed understanding of the features and technical contents of the embodiments of the disclosure, the implementation of the embodiments of the disclosure will be described in detail with reference to the attached drawings, which are for reference only and are not intended to limit the embodiments of the disclosure.

In an integrated silicon photonic chip, a germanium material compatible with a CMOS technology may be adopted to implement photoelectric detection. By forming a Ge layer on a silicon slab waveguide, photons are absorbed by using the germanium material to generate charge carriers. At present, in the structure of a germanium-silicon photoelectric detector, the silicon slab waveguide is usually used to guide an optical signal into the structure, and then light carrying the signal is coupled into the Ge layer. Such a structure has the following shortcomings. First, as a structure for transmitting the optical signal, the silicon slab waveguide has obvious nonlinear effect and produces two-photon absorption in the case of high optical power density, so it is difficult to support high optical power detection. Second, due to a small difference in the refractive index between the silicon material and the germanium material, the optical signal transmitted in the silicon slab waveguide is easily coupled to the Ge layer, which leads to the saturable absorption effect on the detector, and then reduces the responsivity of the detector. Third, the whole silicon slab waveguide is generally subjected to P-type or N-type doping to form an electric field and extract the charge carriers. However, the formed P-type or N-type doped region will affect the transmission of the optical signal in the silicon slab waveguide, resulting in the loss in the propagation loss of light and further reducing the responsivity of the detector.

Therefore, the following technical solution of the embodiments of the disclosure is proposed.

Figure 2:
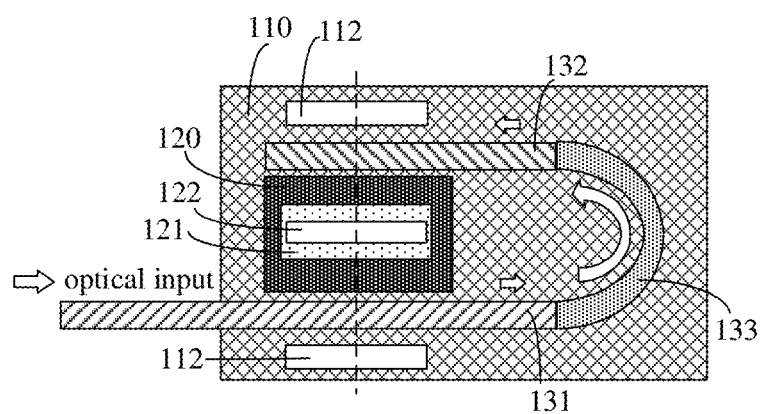
FIG. 2 shows a plan view of an example of a photoelectric detector according to an embodiment of the disclosure.

FIG. 1 shows a side sectional view of an example of a photoelectric detector according to an embodiment of the disclosure. FIG. 2 shows a plan view of an example of a photoelectric detector according to an embodiment of the disclosure. It is to be noted that FIG. 1 is a side sectional view along a dashed line shown in FIG. 2. As shown in FIG. 1 and FIG. 2, the photoelectric detector provided by the example of the disclosure includes a Si layer 110, a Ge layer 120, and a silicon nitride waveguide 130.

The Si layer 110 includes a doped region 111 of a first doping type. The Ge layer 120 is in contact with the Si layer 110 and includes a doped region 121 of a second doping type.

The silicon nitride waveguide 130 is arranged around the Ge layer 120 in the extension directions of at least three sidewalls of the Ge layer 120.

The silicon nitride waveguide 130 is configured to transmit an optical signal and couple the optical signal to the Ge layer 120. The Ge layer 120 is configured to detect the optical signal and convert the optical signal into an electrical signal.

In the embodiments of the disclosure, the photoelectric detector further includes a substrate. The substrate may be an elemental semiconductor material substrate (such as Si substrate and Ge substrate), a composite semiconductor material substrate (such as a Germanium Silicon (SiGe) substrate), or a silicon-on-insulator (SOI) substrate, a germanium-on-insulator (GeOI) substrate, etc. In the embodiments of the disclosure, taking the SOI substrate as the substrate as an example, the photoelectric detector further includes a bottom-layer substrate 140, and the bottom-layer substrate 140 includes, for example, a bottom-layer silicon material. A buried oxide layer (not shown in the figure) is arranged on the bottom-layer substrate 140. The Si layer 110 is formed on the buried oxide layer. The Ge layer 120 is formed on the Si layer 110, and the silicon nitride waveguide 130 is arranged around the Ge layer 120 in the extension direction of at least three sidewalls of the Ge layer 120. A silicon dioxide material is provided between the silicon nitride waveguide 130 and the Ge layer 120, and a silicon dioxide material is provided between the silicon nitride waveguide 130 and the Si layer 110. As shown in FIG. 1, the silicon dioxide material 150 covers the Si layer 110 and the Ge layer 120, the silicon nitride waveguide 130 is arranged in the silicon dioxide material 150 and separated by a certain distance from the Si layer 110 and the Ge layer 120. The silicon dioxide material is configured to support and fix the silicon nitride waveguide 130, and has a low refractive index, so that the transmitted optical signal can be optically constrained.

In the embodiments of the disclosure, the difference in the refractive index between the silicon nitride waveguide 130 and the Ge layer 120 is large, and the silicon nitride waveguide 130 is arranged around the Ge layer 120, which not only can ensure the high coupling efficiency of the optical signal from the silicon nitride waveguide 130 to the Ge layer 120, but also enables the optical signals to be uniformly distributed in the Ge layer 120, thus avoiding a premature saturation phenomenon of the detector caused by the accumulation of photo-generated carriers due to strong local light field of the Ge layer 120. It is to be understood that the higher the coupling efficiency is, the more photons are coupled into the Ge layer 120, so that only a short coupling region length is needed to achieve high response speed. It is to be noted that the length of the coupling region is equal to the length of the Ge layer 120.

In the embodiment of the disclosure, the silicon nitride optical waveguide 130 is not only used to implement propagation and diversion of the optical signal, but also coupled with the Ge layer 120, thereby forming a built-in electric field, and generating charge carriers.

In the embodiments of the disclosure, a silicon nitride material with low nonlinearity is used as a transmission optical waveguide, so that the silicon nitride waveguide does not cause two-photon absorption effect, and can support low-loss optical transmission with high optical power density and large optical bandwidth.

The projection of the sidewall of the Ge layer 120 on the Si layer 110 has a first shape, and the length of the first shape in the first direction is larger than the length in the second direction.

The silicon nitride waveguide 130 includes a first waveguide region 131, a second waveguide region 132, and a third waveguide region 133. The first waveguide region 131 and the second waveguide region 132 surround the Ge layer 120 at the outer sides of a first sidewall and a second sidewall of the Ge layer 120, respectively. The first sidewall and the second sidewall are two opposite sidewalls of the Ge layer 120 parallel to the first direction. The third waveguide region 133 connects the first waveguide region 131 and the second waveguide region 132 in the second direction.

In the embodiments of the disclosure, the projection of the sidewall of the Ge layer 120 on the Si layer 110 has a first shape, as shown in FIG. 2. In the figure, the dashed line direction is the second direction and the direction perpendicular to the dashed line direction is the first direction. In the example shown in FIG. 2, the first shape may be a rectangle having a long side extending in the first direction and a short side extending in the second direction. Herein, the length of the first shape in the first direction is the length of the long side of the rectangle, and the length of the first shape in the second direction is the length of the short side of the rectangle. It is to be understood from FIG. 2 that the length of the coupling region is the length of the first shape in the first direction.

It is to be noted that, as shown in FIG. 1, the first sidewall and the second sidewall of the Ge layer 120 are considered as the left sidewall and the right sidewall of the Ge layer 120 (in the first direction), respectively.

The first waveguide region 131 and the second waveguide region 132 are straight waveguide regions.

The third waveguide region 133 is a bent waveguide region.

In the embodiments of the disclosure, as shown in FIG. 2, the first waveguide region 131 and the second waveguide region 132 are located outside the first sidewall and the second sidewall of the Ge layer 120, respectively. That is, the first waveguide region 131 and the second waveguide region 132 are located on the left and right sides of the Ge layer 120 (in the first direction), respectively.

In the embodiments of the disclosure, the third waveguide region 133 is configured to divert the optical signal of the first waveguide region 131 by 180 degrees and then transmit same to the second waveguide region 132. It is to be noted that in the embodiments of the disclosure, explanation is made by taking the first waveguide region 131 as an optical input waveguide region as an example.

The optical signal transmitted by the silicon nitride waveguide 130 is propagated in a direction from the first waveguide region 131 to the third waveguide region 133 to the second waveguide region 132.

The distance between the first waveguide region 131 and the Ge layer 120 is larger than the distance between the second waveguide region 132 and the Ge layer 120.

In the embodiments of the disclosure, the first waveguide region 131 is the optical input waveguide region, and the optical signal transmitted by the silicon nitride waveguide 130 is propagated in the direction from the first waveguide region 131 to the third waveguide region 133 to the second waveguide region 132. Therefore, the intensity of the optical signal transmitted by the first waveguide region 131 is greater than the intensity of the optical signal transmitted by the second waveguide region 132 (because the optical signal transmitted is partially absorbed by the Ge layer 120 in the first waveguide region 131 and then transmitted to the second waveguide region 132 through the third waveguide region 133, the optical signal transmitted by the second waveguide region 132 is the remaining optical signal after being coupled once through the Ge layer 120). So, when the silicon nitride waveguide 130 is formed, the first waveguide region 131 may be arranged at a position farther from the Ge layer 120 than the second waveguide region 132. Therefore, when the intensity of the optical signal transmitted by the first waveguide region 131 is strong, the coupling speed between the optical signal transmitted by the first waveguide region 131 and the Ge layer 120 is controlled to avoid the premature saturation phenomenon of the Ge layer 120; when the intensity of the optical signal transmitted by the second waveguide region 132 is weak, all the remaining optical signals in the second waveguide region 132 can be coupled to the Ge layer 120, thereby improving the coupling efficiency.

In the embodiments of the disclosure, the first waveguide region 131 and the second waveguide region 132 are respectively located on two sides of the Ge layer 120. The first waveguide region 131 and the second waveguide region 132 are connected by the third waveguide region 133, so that the optical signal transmitted in the silicon nitride waveguide 130 is coupled with the Ge layer 120 at least twice. Thus, the responsivity of the photoelectric detector can be improved without increasing the length of the Ge layer 120 and reducing the 3 dB photoelectric bandwidth of the photoelectric detector.

The area of the cross section of the silicon nitride waveguide 130 in the direction perpendicular to the input direction of the optical signal is 0.06 $\mu m^2$ to 0.5 $\mu m^2$. It is to be noted that the cross section of the silicon nitride waveguide 130 in the direction perpendicular to the input direction of the optical signal may be a rectangle or a trapezoid. In the embodiment of the disclosure, explanation is made by taking the cross section of the silicon nitride waveguide 130 in the direction perpendicular to the input direction of the optical signal being a rectangle as an example. In practical application, the cross section of the silicon nitride waveguide 130 in the direction perpendicular to the input direction of the optical signal may also be a trapezoid (the length of the bottom edge, close to the Si layer 110, of the trapezoid is larger than the length of the top edge away from the Si layer 110).

The distance between the portion, surrounding the Ge layer 120, of the silicon nitride waveguide 130 and the Ge layer 120 is 50 nm to 1000 nm.

The extension direction of the silicon nitride waveguide 130 is parallel to the contact plane of the Si layer 110 and the Ge layer 120, and the distance between the silicon nitride waveguide 130 and the Si layer 110 is 100 nm to 1200 nm.

The length of the Ge layer 120 in the first direction is 5 $\mu m$ to 100 $\mu m$. That is, the length of the coupling region is 5 $\mu m$ to 100 $\mu m$. By controlling the length of the Ge layer 120 in the first direction, the length of the coupling region may be controlled.

It is to be noted that the photoelectric detector provided by the embodiment of the disclosure may be provided with following preferred dimensions: the cross section (the cross section shown in FIG. 1) of the silicon nitride waveguide 130 in the direction perpendicular to the input direction of the optical signal is 800 nm in length and 300 nm in width; the cross section (the cross section shown in FIG. 1) of the Ge layer 120 in the direction perpendicular to the input direction of the optical signal is 3 $\mu m$ in length and 500 nm in width; the length of the Ge layer 120 in the first direction (that is, the length of the coupling region) is 12 $\mu m$; the distance between the silicon nitride waveguide 130 and the Si layer 110 is 150 nm; the distance between the first waveguide region 131 and the Ge layer 120 is 100 nm; and the distance between the second waveguide region 132 and the Ge layer 120 is 80 nm.

As shown in FIGS. 1 and 2, the Si layer 110 includes a doped region 111 of a first doping type. The Ge layer 120 includes a doped region 121 of a second doping type. The doped region 111 of the first doping type and the doped region 121 of the second doping type are respectively provided with a first metal electrode 112 and a second metal electrode 122. The first doping type is P-type, and the second doping type is N-type, so as to form a photoelectric detector with a PIN structure. Alternatively, the first doping type is N-type, and the second doping type is P-type, so as to form a photoelectric detector with a NIP structure.

In the embodiment of the disclosure, the doped region 111 of the first doping type is formed on an upper surface of the Si layer 110. It is to be noted that there may be one or more doped regions 111 of the first doping type formed on the upper surface of the Si layer 110. FIGS. 1 and 2 only illustrate the case where two doped regions 111 of the first doping type are formed on the Si layer 110. The two doped regions 111 of the first doping type are respectively provided with first metal electrodes 112. A doped region 121 of the second doping type is formed on an upper surface of the Ge layer 120; and a second metal electrode 122 is arranged on the doped region of the second doping type. The first doping type may be P-type or N-type. When the first doping type is P-type, the second doping type is N-type, so as to form a photoelectric detector with a PIN structure. When the first doping type is N-type, the second doping type is P-type, so as to form a photoelectric detector with a NIP structure. It is to be noted that an undoped region between the Si layer 110 and the Ge layer 120 serves as an intrinsic body in the PIN structure or the NIP structure.

In the embodiment of the disclosure, the Si layer 110 may also be a doped Si layer. When the first doping type is P-type, the Si layer 110 may be an overall P-type doped Si layer, but the doping concentration of the doped region is higher than the overall doping concentration of the Si layer 110. When the first doping type is N-type, the Si layer 110 may be an overall N-type doped Si layer, but the doping concentration of the doped region is higher than the overall doping concentration of the Si layer 110. It is to be understood that since the silicon nitride waveguide is used to transmit the optical signal, the adverse effect on optical signal transmission in the case where the doped Si layer serves as the waveguide can be avoided, thereby effectively reducing the loss in the transmission of the optical signal.

In the embodiment of the disclosure, an applied voltage is applied between the first metal electrode 112 on the Si layer 110 and the second metal electrode 122 on the Ge layer 120 so as to form an applied electric field, extracting charge carriers generated in the Ge layer 120. In addition, the electric field direction of the applied electric field is the same as the electric field direction of a built-in electric field formed in the Ge layer 120, so that the applied electric field may accelerate the moving speed of the charge carriers, thereby improving the responsivity of the photoelectric detector. It is to be noted that in the case where two first metal electrodes 112 are arranged on the Si layer 110, the first metal electrodes 112 may be respectively connected to the second metal electrode 122 to form an applied electric field. That is, in the case where two first metal electrodes 112 are arranged on the Si layer 110, two applied electric fields may be formed between the first metal electrodes 112 and the second metal electrode 122.

In the embodiment of the disclosure, as shown in FIG. 2, the length of the metal electrodes (112 and 122) in the first direction is smaller than the length of the Ge layer 120 in the first direction. The upper surfaces of the metal electrodes (112 and 122) are exposed to the upper surface of the photoelectric detector.

In the embodiment of the disclosure, the doped region structures of the Ge layer 120 and the Si layer 110 may also be changed so as to implement avalanche gain detection (APD). The specific implementation mode may include that: an avalanche region is additionally arranged on the Ge layer 120, or a reverse bias voltage greater than 6V is applied to the formed NIP structure or PIN structure to implement avalanche gain detection.

The embodiment of the disclosure provides a photoelectric detector, which includes: a Si layer, a Ge layer, and a silicon nitride waveguide. The Si layer includes a first-doping-type doped region. The Ge layer is in contact with the Si layer, and includes a second-doping-type doped region. The silicon nitride waveguide is arranged around the Ge layer in the extension direction of at least three sidewalls of the Ge layer. The silicon nitride waveguide is configured to transmit an optical signal and couple the optical signal to the Ge layer, and the Ge layer is configured to detect the optical signal and convert the optical signal into an electrical signal. The difference in the refractive index between the silicon nitride waveguide and the refractive index of the Ge layer is large, and the silicon nitride waveguide is arranged around the Ge layer, which not only can ensure the high coupling efficiency of the optical signal from the silicon nitride waveguide to the Ge layer, but also enables the optical signals to be uniformly distributed in the Ge layer, thus avoiding a premature saturation phenomenon of the detector caused by the accumulation of photo-generated carriers due to strong local light field in the Ge layer. It is to be understood that the higher the coupling efficiency is, the more photons are coupled into the Ge layer, so that only a short coupling region length is needed to achieve high response speed.

Figure 3:
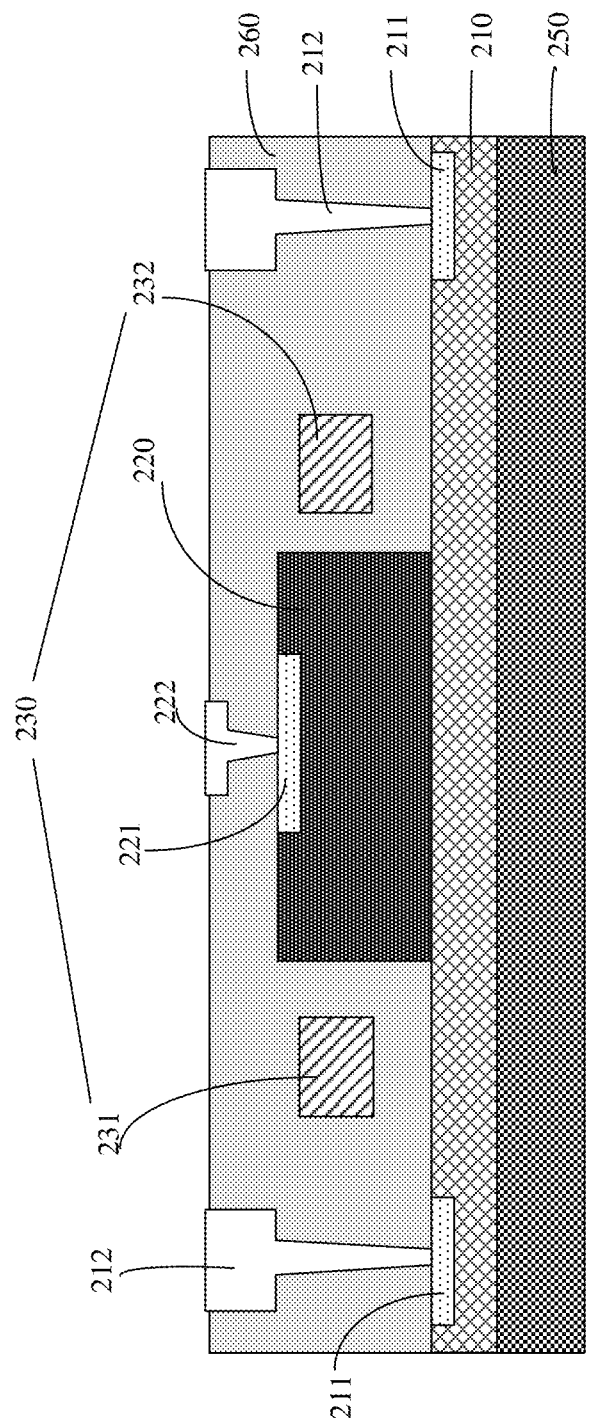
FIG. 3 shows a side sectional view of another example of a photoelectric detector according to an embodiment of the disclosure.
Figure 4:
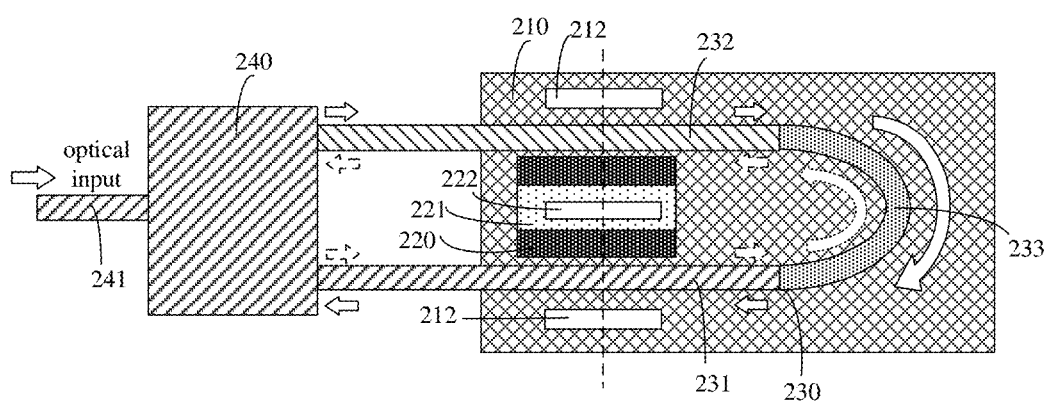
FIG. 4 shows a plan view of another example of a photoelectric detector according to an embodiment of the disclosure.

In another embodiment of the disclosure, FIG. 3 shows a side sectional view of another example of a photoelectric detector according to an embodiment of the disclosure. FIG. 4 shows a plan view of another example of a photoelectric detector according to an embodiment of the disclosure. It is to be noted that FIG. 3 is a side sectional view along a dashed line in FIG. 4. As shown in FIGS. 3 and 4, the photoelectric detector provided by the embodiments of the disclosure includes a Si layer 210, a Ge layer 220, a silicon nitride waveguide 230, and a light splitting waveguide 240.

The Si layer 210 includes a doped region 211 of a first doping type.

The Ge layer 220 is in contact with the Si layer 210, and includes a doped region 221 of a second doping type.

The silicon nitride waveguide 230 includes a first waveguide region 231 and a second waveguide region 232. The Ge layer 220 is arranged between the first waveguide region 231 and the second waveguide region 232.

The light splitting waveguide 240 is connected to the silicon nitride waveguide 230, and is configured to split the received optical signal into at least two paths of optical signals, and output two optical paths of signals to the first waveguide region 231 and the second waveguide region 232, respectively.

Herein, the silicon nitride waveguide 230 is configured to transmit an optical signal and couple the optical signal to the Ge layer 220, and the Ge layer 220 is configured to detect the optical signal and convert the optical signal into an electrical signal.

The material of the light splitting waveguide 240 is the same as the material of the silicon nitride waveguide 230.

It is to be noted that in the embodiments of the disclosure, explanation is made by taking dividing the optical signal received by the light splitting waveguide 240 into two optical signals as an example.

In the embodiments of the disclosure, the light splitting waveguide 240 may be a silicon nitride light splitting waveguide. As shown in FIG. 3, the light splitting waveguide 240 is a rectangle. It is to be noted that the light splitting waveguide 240 may be any light splitting waveguide capable of splitting a received optical signal into at least two paths of optical signals, and the shape thereof is not limited in the disclosure.

In the embodiments of the disclosure, the photoelectric detector further includes a bottom-layer substrate 250. The bottom-layer substrate 250 is, for example, a bottom-layer silicon material. A buried oxide layer (not shown in the figure) is arranged on the bottom-layer substrate 250. The Si layer 210 is formed on the buried oxide layer. The Ge layer 220 is formed on the Si layer 210 and arranged between the first waveguide region 231 and the second waveguide region 232. A silicon dioxide material is provided between the silicon nitride waveguide 230 and the Ge layer 220, and is also provided between the silicon nitride waveguide 230 and the Si layer 210. As shown in FIG. 3, the silicon dioxide material 260 covers the Si layer 210 and the Ge layer 220, the silicon nitride waveguide 230 is arranged in the silicon dioxide material 260 and separated by a certain distance from each of the Si layer 210 and the Ge layer 220. The silicon dioxide material is used to support and fix the silicon nitride waveguide 230, and has a low refractive index, so that the transmitted optical signal can be optically constrained.

In the embodiments of the disclosure, the difference between the refractive index of the silicon nitride waveguide 230 and the refractive index of the Ge layer 220 is large, and the silicon nitride waveguide 230 is arranged around the Ge layer 220, which not only can ensure the high coupling efficiency of the optical signal from the silicon nitride waveguide 230 to the Ge layer 220, but also enables the optical signals to be uniformly distributed in the Ge layer 220, thus avoiding a premature saturation phenomenon of the detector caused by the accumulation of photo-generated carriers due to strong local light field in the Ge layer 220. It is to be understood that the higher the coupling efficiency is, the more photons are coupled into the Ge layer 220, so that a short coupling region length would be needed to achieve high response speed. It is to be noted that the length of the coupling region is equal to the length of the Ge layer 220.

In the embodiments of the disclosure, the light splitting waveguide 240 is arranged to split the input optical signal, and output the split optical signals to the first waveguide region 231 and the second waveguide region 232, respectively, and the Ge layer 220 is arranged between the first waveguide region 231 and the second waveguide region 232, so that the optical signal in the silicon nitride waveguide 230 may be coupled with the Ge layer 220 at least twice. Thus, without increasing the length of the coupling region of the detector (that is, the length of the Ge layer 220), the responsivity of the detector can be improved.

In the embodiments of the disclosure, the silicon nitride optical waveguide 230 is not only used to implement propagation and diversion of the optical signal, but also coupled with the Ge layer 220, thereby forming a built-in electric field and generating charge carriers.

In the embodiments of the disclosure, a silicon nitride material with low nonlinearity is used as a transmission optical waveguide, so that the silicon nitride waveguide does not have two-photon absorption effect. In addition, the silicon nitride waveguide supports low-loss optical transmission with high optical power density and large optical bandwidth.

The projection of the sidewall of the Ge layer 220 on the Si layer 210 has a first shape, and the length of the first shape in the first direction is larger than the length in the second direction.

The first waveguide region 231 and the second waveguide region 232 surround the Ge layer 220 at the outer sides of a first sidewall and a second sidewall of the Ge layer 220, respectively, and the first sidewall and the second sidewall are two opposite sidewalls of the Ge layer 220 parallel to the first direction.

In the embodiments of the disclosure, the projection of the sidewall of the Ge layer 220 on the Si layer 210 has a first shape, as shown in FIG. 4. In this figure, the dashed line direction is the second direction and the direction perpendicular to the dashed line direction is the first direction. In the example shown in FIG. 4, the first shape may be a rectangle. The rectangle is provided with a long side extending in the first direction and a short side extending in the second direction. Herein, the length of the first shape in the first direction is the length of the long side of the rectangle, and the length of the first shape in the second direction is the length of the short side of the rectangle. It is to be understood from FIG. 4 that the length of the coupling region is the length of the first shape in the first direction.

It is to be noted that, as shown in FIG. 3, the first sidewall and the second sidewall of the Ge layer 220 are respectively the left sidewall and the right sidewall of the Ge layer 220 (in the first direction).

The silicon nitride waveguide 230 further includes a third waveguide region 233. The third waveguide region 233 connects the first waveguide region 231 and the second waveguide region 232 in the second direction.

The optical signal output from the light splitting waveguide 240 to the first waveguide region 231 is transmitted to the second waveguide region 232 along the third waveguide region 233, and the optical signal output from the light splitting waveguide 240 to the second waveguide region 232 is transmitted to the first waveguide region 231 along the third waveguide region 233.

It is to be noted that the third waveguide region 233 connecting the first waveguide region 231 and the second waveguide region 232 is only a connection mode provided in the embodiments of the disclosure. The embodiments of the disclosure are not limited to the case where the first waveguide region 231 and the second waveguide region 232 are connected by the third waveguide region 233, and the first waveguide region 231 and the second waveguide region 232 may also not be connected.

In the embodiments of the disclosure, both the first waveguide region 231 and the second waveguide region 232 may be optical input waveguide regions, and the optical signal output from the light splitting waveguide 240 may be transmitted in the direction from the first waveguide region 231 to the third waveguide region 233 to the second waveguide region 232. Meanwhile, the optical signal output from the light splitting waveguide 240 may also be transmitted in the direction from the second waveguide region 232 to the third waveguide region 233 to the first waveguide region 231. That is, in the embodiments of the disclosure, at least two paths of optical signals are transmitted in opposite directions in the silicon nitride waveguide 230. It is to be understood that each optical signal may be coupled with the Ge layer 220 at least twice via the first waveguide region 231 and the second waveguide region 232. Therefore, the responsivity of the photoelectric detector can be improved without increasing the length of the Ge layer 220 and reducing the 3 dB photoelectric bandwidth of the photoelectric detector.

The silicon nitride waveguide 230 and the light splitting waveguide 240 enclose a closed area along the transmission direction of the optical signal, and the Ge layer 220 is located in the closed area.

In the embodiment of the disclosure, as shown in FIG. 4, the light splitting waveguide 240 and the third waveguide region 233 are respectively located on a third sidewall and a fourth sidewall of the Ge layer 220, and the third sidewall and the fourth sidewall are two opposite sidewalls of the Ge layer 220 parallel to the second direction, respectively. The third and fourth sidewalls of the Ge layer 220 are the left and right sidewalls of the Ge layer 220 (in the second direction). That is, the light splitting waveguide 240 and the third waveguide region 233 are located on the left and right sides of the Ge layer 220 (in the second direction), respectively.

It is to be noted that the light splitting waveguide 240 is not limited to being located on the side opposite to the third waveguide region 233, and the position of the light splitting waveguide 240 may be adjusted according to actual needs. In the embodiment of the disclosure, the light splitting waveguide 240 may also split the received optical signal into more than two optical signals. For example, the light splitting waveguide 240 splits the received optical signal into three optical signals, and after two optical signals thereof are respectively output to the first waveguide region 231 and the second waveguide region 232, the light splitting waveguide 240 may also output the remaining optical signal to another waveguide region, such as a waveguide region (not shown in the figure) above the Ge layer 220.

In the embodiment of the disclosure, as shown in FIG. 3, the light splitting waveguide 240 is connected to the first waveguide region 231 and the second waveguide region 232, so that the light splitting waveguide 240, the first waveguide region 231, the second waveguide region 232 and the third waveguide region 233 enclose a closed area along the transmission direction of the optical signal, and the Ge layer 220 is located in the closed area.

The first waveguide region 231 and the second waveguide region 232 are straight waveguide regions.

The third waveguide region 233 is a bent waveguide region.

In the embodiments of the disclosure, as shown in FIG. 4, the first waveguide region 231 and the second waveguide region 232 are located outside the first sidewall and the second sidewall of the Ge layer 220, respectively. That is, the first waveguide region 231 and the second waveguide region 232 are located at the left and right sides of the Ge layer 220 (in the first direction), respectively.

In the embodiments of the disclosure, the third waveguide region 233 is configured to divert the optical signal of the first waveguide region 231 by 180 degrees and then transmit same to the second waveguide region 231, and to divert the optical signal of the second waveguide region 232 by 180 degrees and then transmit same to the first waveguide region 231.

The area of the cross section of the silicon nitride waveguide 230 in the direction perpendicular to the input direction of the optical signal is 0.06 $\mu m^2$ to 0.5 $\mu m^2$.

It is to be noted that the cross section of the silicon nitride waveguide 230 in the direction perpendicular to the transmission direction of the optical signal may have a shape of a rectangle or a trapezoid. In the embodiment of the disclosure, explanation is made by taking the cross section of the silicon nitride waveguide 230 in the direction perpendicular to the transmission direction of the optical signal being in shape of a rectangle as an example. In practical application, the cross section of the silicon nitride waveguide 230 in the direction perpendicular to the transmission direction of the optical signal may also have a shape of a trapezoid (the length of the bottom edge, close to the Si layer 210, of the trapezoid is larger than the length of the top edge away from the Si layer 210).

The distance between the Ge layer 220 and each of the first waveguide region 231 or the second waveguide region 232 is 50 nm to 1000 nm.

The extension direction of the silicon nitride waveguide 230 is parallel to the contact plane of the Si layer 210 and the Ge layer 220, and the distance between the silicon nitride waveguide 230 and the Si layer 210 is 100 nm to 1200 nm.

The length of the Ge layer 220 in the first direction is 5 $\mu m$ to 100 $\mu m$. That is, the length of the coupling region is 5 μm to 100 μm. By controlling the length of the Ge layer 220 in the first direction, the length of the coupling region may be controlled.

It is to be noted that the photoelectric detector provided by the embodiment of the disclosure may be provided with following preferred dimensions: the cross section (the cross section shown in FIG. 3) of the silicon nitride waveguide 230 in the direction perpendicular to the input direction of the optical signal is 800 nm in length and 300 nm in width; the cross section (the cross section shown in FIG. 3) of the Ge layer 220 in the direction perpendicular to the input direction of the optical signal is 3 μm in length and 500 nm in width; the length of the Ge layer 220 in the first direction (that is, the length of the coupling region) is 12 μm; the distance between the silicon nitride waveguide 230 and the Si layer 210 is 150 nm; the distance between the first waveguide region 231 and the Ge layer 220 is 100 nm; and the distance between the second waveguide region 232 and the Ge layer 220 is 100 nm.

In the embodiment of the disclosure, as shown in FIG. 4, the other end of the light splitting waveguide 240 may also be connected to an optical input waveguide 241, and the optical input waveguide 241 is configured to receive an optical signal and transmit the optical signal to the light splitting waveguide 240.

As shown in FIGS. 3 and 4, the Si layer 210 includes a doped region 211 of a first doping type. The Ge layer 220 includes a doped region 221 of a second doping type. The doped region 211 of the first doping type and the doped region 221 of the second doping type are respectively provided with a first metal electrode 212 and a second metal electrode 222. The first doping type is P-type, and the second doping type is N-type, so as to form a photoelectric detector with a PIN structure. Alternatively, the first doping type is N-type, and the second doping type is P-type, so as to form a photoelectric detector with a NIP structure.

In the embodiment of the disclosure, the doped region 211 of the first doping type is formed on an upper surface of the Si layer 210. It is to be noted that there may be one or more doped regions 211 of the first doping type formed on the upper surface of the Si layer 210. FIGS. 3 and 4 only illustrate the case where two doped regions 211 of the first doping type are formed on the Si layer 210. The two doped regions 211 of the first doping type are respectively provided with first metal electrodes 212. A doped region 121 of the second doping type is formed on an upper surface of the Ge layer 220; and a second metal electrode 222 is arranged on the doped region of the second doping type. The first doping type may be P-type or N-type. When the first doping type is P-type, the second doping type is N-type, so as to form a photoelectric detector with a PIN structure. When the first doping type is N-type, the second doping type is P-type, so as to form a photoelectric detector with a NIP structure. It is to be noted that an undoped region between the Si layer 210 and the Ge layer 220 serves as an intrinsic body in the PIN structure or the NIP structure.

In the embodiment of the disclosure, the Si layer 210 may also be a doped Si layer. When the first doping type is P-type, the Si layer 210 may be an overall P-type doped Si layer, but the doping concentration of the doped region is higher than the overall doping concentration of the Si layer 210. When the first doping type is N-type, the Si layer 210 may be an overall N-type doped Si layer, but the doping concentration of the doped region is higher than the overall doping concentration of the Si layer 210. It is to be understood that since the silicon nitride waveguide is used to transmit the optical signal, the adverse effect on optical signal transmission in the case where the doped Si layer serves as the waveguide can be avoided, thereby effectively reducing the loss in the transmission of the optical signal.

In the embodiment of the disclosure, an applied voltage is applied between the first metal electrode 212 on the Si layer 210 and the second metal electrode 222 on the Ge layer 220 so as to form an applied electric field, extracting charge carriers generated in the Ge layer 220. In addition, the electric field direction of the applied electric field is the same as the electric field direction of a built-in electric field formed in the Ge layer 220, so that the applied electric field may accelerate the moving speed of the charge carriers, thereby improving the responsivity of the photoelectric detector. It is to be noted that in the case where two first metal electrodes 212 are arranged on the Si layer 210, the first metal electrodes 212 may be respectively connected to the second metal electrode 222 to form an applied electric field. That is, in the case where two first metal electrodes 212 are arranged on the Si layer 210, two applied electric fields may be formed between the first metal electrodes 212 and the second metal electrode 222.

In the embodiment of the disclosure, as shown in FIG. 3, the length of the metal electrodes (212 and 222) in the first direction is smaller than the length of the Ge layer 220 in the first direction. The upper surfaces of the metal electrodes are exposed to the upper surface of the photoelectric detector.

In the embodiment of the disclosure, the doped region structures of the Ge layer 220 and the Si layer 210 may also be changed so as to implement avalanche gain detection (APD). The specific implementation mode may include that: an avalanche region is additionally arranged on the Ge layer 220, or a reverse bias voltage greater than 6V is applied to the formed NIP structure or PIN structure to implement avalanche gain detection.

Figure 5:
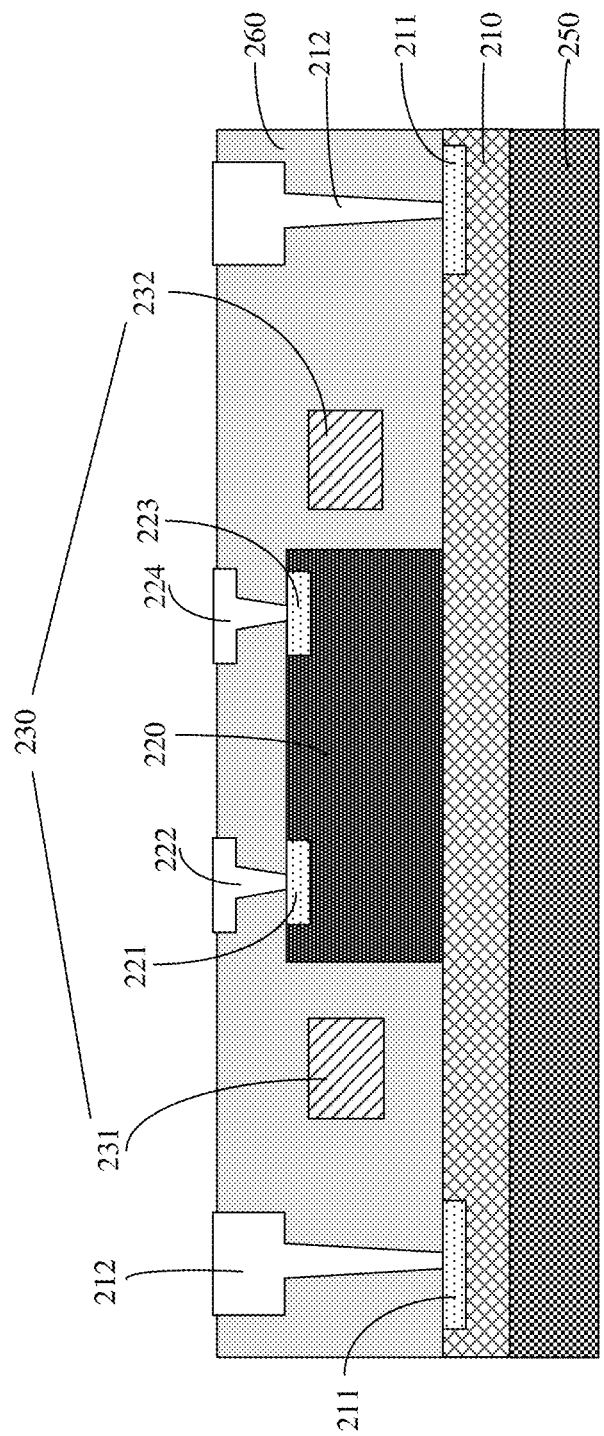
FIG. 5 shows a side sectional view of another example of a photoelectric detector according to an embodiment of the disclosure.

In another embodiment of the disclosure, FIG. 5 is a side sectional view of another implementation mode of a photoelectric detector according to an embodiment of the disclosure. As shown in FIG. 5, a doped region 221 of a second doping type and a doped region 223 of a first doping type are formed on the upper surface of the Ge layer 220. The doped region 221 of the second doping type is provided with a second metal electrode 222, and the doped region 223 of the first doping type is provided with a third metal electrode 224. The first doping type and the second doping type are different doping types. A lateral built-in electric field (a direction from the doped region 221 of the second doping type to the doped region 223 of the first doping type or a direction from the doped region 223 of the first doping type to the doped region 221 of the second doing type) may be formed between the doped region 221 of the second doping type and the doped region 223 of the first doping type on the Ge layer 220 to generate charge carriers.

Figure 6:
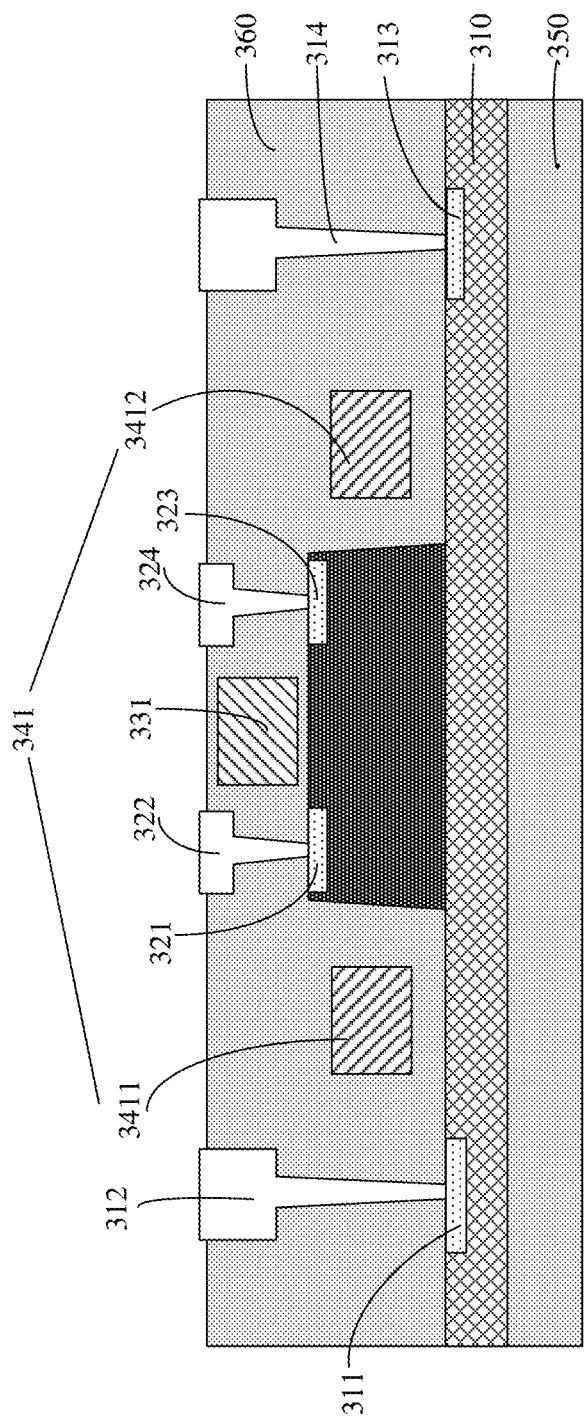
FIG. 6 shows a side sectional view of another example of a photoelectric detector according to an embodiment of the disclosure.
Figure 7:
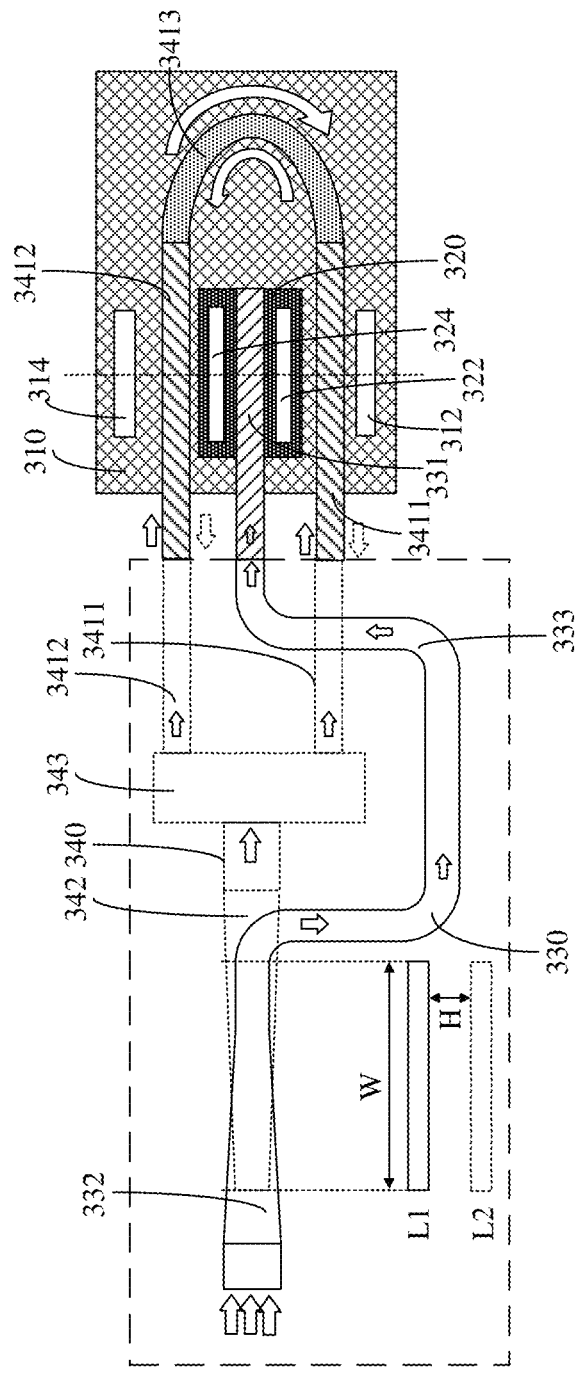
FIG. 7 shows a plan view of another example of a photoelectric detector according to an embodiment of the disclosure.

In another embodiment of the disclosure, FIG. 6 is a side sectional view of another implementation mode of a photoelectric detector according to an embodiment of the disclosure. FIG. 7 is a plan view of another implementation mode of a photoelectric detector according to an embodiment of the disclosure. It is to be noted that FIG. 6 is a side sectional view along a dashed line in FIG. 7. It is also to be noted that, in order to show the upper-lower layer positional relationship of a first waveguide layer and a second waveguide layer, the structure in a dashed frame of FIG. 7 is not hatched, but the material of the structure in the dashed frame of FIG. 7 shall be understood as the same as the material of other structures. In addition, in order to show the waveguide structure more clearly, the scale of the structure inside and outside the dashed frame in FIG. 7 may be different (for example, the structure inside the dashed frame is enlarged in the transverse direction in the figure), so the size or scale of the structure in the figure shall not be understood as limiting the corresponding features in the disclosure. Herein, L1 represents the first waveguide layer and L2 represents the second waveguide layer. L1 and L2 are only used to illustrate the first waveguide layer and the second waveguide layer, and are not used to limit the shapes and lengths of the first waveguide layer and the second waveguide layer in the disclosure.

As shown in FIGS. 6 and 7, the photoelectric detector provided by the embodiment of the disclosure includes a Si layer 310, a Ge layer 320, and a silicon nitride waveguide.

The Si layer 310 includes a doped region 311 of a first doping type.

The Ge layer 320 is in contact with the Si layer 310, and includes a doped region 321 of a second doping type.

The silicon nitride waveguide includes a first waveguide layer 330 and a second waveguide layer 340. The first waveguide layer 330 includes a fourth waveguide region 331 arranged above the Ge layer 320, and the second waveguide layer 340 includes a first waveguide region 3411, a second waveguide region 3412 and a third waveguide region 3413 arranged on the side face of the Ge layer 320.

Herein, the first waveguide layer 330 and the second waveguide layer 340 are configured to transmit an optical signal. The first waveguide layer 330 and the second waveguide layer 340 couple the optical signal to the Ge layer 320 through the fourth waveguide region 331, the first waveguide region 3411, the second waveguide region 3412 and the third waveguide region 3413, respectively. The Ge layer 320 is configured to detect the optical signal and convert the optical signal into an electrical signal.

In the embodiment of the disclosure, the photoelectric detector further includes a bottom-layer substrate 350. The bottom-layer substrate 350 is, for example, a bottom-layer silicon material. A buried oxide layer (not shown in the figure) is arranged on the bottom-layer substrate 350. The Si layer 310 is formed on the buried oxide layer. The Ge layer 320 is formed on the Si layer 310, the fourth waveguide region 331 is arranged above the Ge layer 320, the first waveguide region 3411, the second waveguide region 3412 and the third waveguide region 3413 are arranged around the Ge layer 320 in the extension direction of at least three sidewalls of the Ge layer 320. Moreover, silicon dioxide materials are arranged between the fourth waveguide region 331 and the Ge layer 320, between the first waveguide region 3411 and the Ge layer 320, between the second waveguide region 3412 and the Ge layer 320, and between the third waveguide region 3413 and the Ge layer 320. And silicon dioxide materials are also arranged between the fourth waveguide region 331 and the Si layer 310, between the first waveguide region 3411 and the Si layer 310, between the second waveguide region 3412, between the Si layer 310, and between the third waveguide region 3413 and the Si layer 310. As shown in FIG. 6, the silicon dioxide material 360 covers the Si layer 310 and the Ge layer 320. The fourth waveguide region 331, the first waveguide region 3411, the second waveguide region 3412, and the third waveguide region 3413 are arranged in the silicon dioxide material 360, and separated by a certain distance from each of the Si layer 310 and the Ge layer 320. The silicon dioxide material is configured to support and fix the fourth waveguide region 331, the first waveguide region 3411, the second waveguide region 3412 and the third waveguide region 3413, and has a low refractive index, so that the transmitted optical signal may be optically constrained.

In the embodiment of the disclosure, the first waveguide 330, the second waveguide 340, and the fourth waveguide region 331 are located above the Ge layer 320, and the first waveguide region 3411, the second waveguide region 3412 and the third waveguide region 3413 are arranged around the side face of the Ge layer, so that the optical signal may be coupled with the Ge layer 320 via multiple faces thereof. Therefore, the detected optical signal can be transmitted to the coupling region through multiple coupling paths, thereby reducing the optical power density in each coupling path. This not only ensures the high coupling efficiency of the optical signal from the waveguide to the Ge layer 320, but also enables the optical signals uniformly distributed in the Ge layer 320, thus avoiding a premature saturation phenomenon of the detector caused by the accumulation of photo-generated carriers due to strong local light field in the Ge layer 320. It is to be understood that the higher the coupling efficiency is, the more photons are coupled into the Ge layer 320, so that a short coupling region would be needed to achieve high response speed. Therefore, there is no need to increase the length of the coupling region of the detector, which not only avoids the device from being oversize, but also suppresses the transmission loss. It is to be noted that the length of the coupling region is equal to the length of the Ge layer 320.

In the embodiment of the disclosure, the fourth waveguide region 331, the first waveguide region 3411, the second waveguide region 3412 and the third waveguide region 3413 are not only used to implement propagation and diversion of the optical signal, but also coupled with the Ge layer 320, thereby forming a built-in electric field and generating charge carriers.

In an alternative embodiment, optical signal transmission is implemented between the first waveguide layer 330 and the second waveguide layer 340 through interlayer coupling.

Particularly, the first waveguide layer 330 may further include a first interlayer coupling region 332 connected to the fourth waveguide region 331.

The second waveguide layer 340 may further include a second interlayer coupling region 342 connected to the first waveguide region 3411 and the second waveguide region 3412.

Optical signal transmission is implemented between the first waveguide layer 330 and the second waveguide layer 340 through interlayer coupling of the first interlayer coupling region 332 and the second interlayer coupling region 342. Optical signals of the first interlayer coupling region 332 and the second interlayer coupling region 342 are respectively transmitted to the fourth waveguide region 331, the first waveguide region 3411, the second waveguide region 3412 and the third waveguide region 3413.

It is to be understood that since the received (that is, needing to be detected) optical signal is split to upper layer light and lower layer light by interlayer coupling between the first waveguide layer 330 and the second waveguide layer 340, the optical power density transmitted in each waveguide layer is reduced in the case where the total amount of the detected optical signals is constant. Therefore, the optical signal may be more effectively coupled to the Ge layer 320 at positions of the fourth waveguide region 331, the first waveguide region 3411, the second waveguide region 3412 and the third waveguide region 3413.

One of the first waveguide layer 330 and the second waveguide layer 340 is configured to receive an optical signal from the outside of the photoelectric detector, and then transmit the optical signal to the other one through interlayer coupling.

In an alternative embodiment, the first waveguide layer 330 is configured to receive the optical signal, and transmit, in the first interlayer coupling region 332, the received optical signal to the second interlayer coupling region 342 of the second waveguide layer 340 through interlayer coupling 342.

In the embodiment, as shown in FIG. 7, after an optical signal enters the first waveguide layer 330, the optical signal is coupled into the second interlayer coupling region 342 of the second waveguide layer 340 via the first interlayer coupling region 332, the remaining optical signal after interlayer coupling by the first interlayer coupling region 332 is transmitted to the fourth waveguide region 331, and the optical signal obtained by the second interlayer coupling region 342 after interlayer coupling is transmitted to the first waveguide region 3411 and the second waveguide region 3412.

In an alternative embodiment, the cross-sectional area of the first interlayer coupling region 332 becomes smaller and the cross-sectional area of the second interlayer coupling region 342 becomes larger in the transmission direction of the optical signal.

In the embodiment, as shown in FIG. 7, the first interlayer coupling region 332 and the second interlayer coupling region 342 are, for example, inverted tapered waveguides. The cross-sectional area of the first interlayer coupling region 332 (in the direction perpendicular to the optical signal transmission direction) becomes smaller in the optical signal transmission direction. The cross-sectional area of the second interlayer coupling region 342 (in the direction perpendicular to the optical signal transmission direction) becomes larger in the optical signal transmission direction. After the optical signal enters the first interlayer coupling region 332, the mode field of the optical signal gradually increases with the decrease of the cross-sectional area of the first interlayer coupling region 332, and the dispersed mode field distribution better facilitates interlayer optical coupling. At a narrow end (which may be regarded as a position where the cross-sectional area of the first interlayer coupling region 332 is the smallest) of the first interlayer coupling region 332, the optical signal is coupled from the first interlayer coupling region 332 into the second interlayer coupling region 342. Since the cross-sectional area of the second interlayer coupling region 342 is large at the position corresponding to the narrow end of the first interlayer coupling region 332, when the optical signal of the first interlayer coupling region 332 is coupled into the second interlayer coupling region 342, the coupling efficiency is high and the coupling loss is low.

The orthographic projection of the first interlayer coupling region 332 on the Si layer 310 is at least partially overlapped with the orthographic projection the second interlayer coupling region 342 on the Si layer 310.

In the embodiment of the disclosure, as shown in FIG. 7, the inverted tapered first interlayer coupling region 332 is partially overlapped with the inverted tapered second interlayer coupling region 342. In practical application, the coupling ratio between the first interlayer coupling region 332 and the second interlayer coupling region 342 may be adjusted by adjusting the length W of the interlayer coupling region between the first interlayer coupling region 332 and the second interlayer coupling region 342. For example, the larger W is, the larger the coupling ratio between the first interlayer coupling region 332 and the second interlayer coupling region 342 is. That is, the more optical signals are coupled into the second interlayer coupling region 342, the less optical signals remain in the first interlayer coupling region 332. Therefore, W may be adjusted according to actual coupling ratio requirements.

The second waveguide layer 340 further includes a light splitting waveguide region 343 located at the second interlayer coupling region 341, and between the first waveguide region 3411 and the second waveguide region 3412. The light splitting waveguide region 343 is configured to split the optical signal transmitted from the second interlayer coupling region 342 into at least two paths, and output two paths of the optical signals thereof to the first waveguide region 3411 and the second waveguide region 3412 respectively.

In the embodiment of the disclosure, the projection of the sidewall of the Ge layer 320 on the Si layer 310 has a first shape, and the length of the first shape in the first direction is greater than the length in the second direction. The first waveguide region 3411 and the second waveguide region 3412 surround the Ge layer 320 at the outer sides of the first sidewall and the second sidewall of the Ge layer 320, respectively. The first sidewall and the second sidewall are two opposite sidewalls of the Ge layer 320 parallel to the first direction. In the embodiment of the disclosure, the projection of the sidewall of the Ge layer 320 on the Si layer 310 has a first shape, as shown in FIG. 7. In the figure, the dashed line direction is the second direction and the direction perpendicular to the dashed line direction is the first direction. In the embodiment shown in FIG. 7, the first shape may be a rectangle. The rectangle is provided with a long side extending in the first direction and a short side extending in the second direction. Herein, the length of the first shape in the first direction is the length of the long side of the rectangle, and the length of the first shape in the second direction is the length of the short side of the rectangle. It is to be understood from FIG. 7 that the length of the coupling region is the length of the first shape in the first direction.

It is to be noted that, as shown in FIG. 6, the first sidewall and the second sidewall of the Ge layer 320 are the left sidewall and the right sidewall of the Ge layer 320 (in the first direction), respectively.

In the embodiment of the disclosure, the third waveguide region 3413 connects the first waveguide region 3411 and the second waveguide region 3412 in the second direction. The optical signal output from the light splitting waveguide region 343 to the first waveguide region 3411 is transmitted to the second waveguide region 3412 along the third waveguide region 3413, and the optical signal output from the light splitting waveguide region 343 to the second waveguide region 3412 is transmitted to the first waveguide region 3411 along the third waveguide region 3413.

It is to be noted that the third waveguide region 3413 connecting the first waveguide region 3411 and the second waveguide region 3412 is only a connection mode provided in the embodiments of the disclosure. The embodiments of the disclosure are not limited to the case where the first waveguide region 3411 and the second waveguide region 3412 are connected by the third waveguide region 3413, while the first waveguide region 3411 and the second waveguide region 3412 may also not be connected.

In the embodiment of the disclosure, the first waveguide region 3411, the second waveguide region 3412 and the third waveguide region 3413 of the second waveguide layer 340 are arranged around the sidewall of the Ge layer 320 at the side face of the Ge layer 320.

In the embodiment of the disclosure, both the first waveguide region 3411 and the second waveguide region 3412 may be optical input waveguide regions. The optical signal output from the light splitting waveguide region 343 may be transmitted in the direction from the first waveguide region 3411 to the third waveguide region 3413 to the second waveguide region 3412. Meanwhile, the optical signal output from the light splitting waveguide region 343 may also be transmitted in the direction from the second waveguide region 3412 to the third waveguide region 3413 to the first waveguide region 3411. That is, in the embodiments of the disclosure, at least two paths of optical signals are transmitted in opposite directions in the first waveguide region, the second waveguide region and the third waveguide region. It is to be understood that each path of the optical signal may be coupled with the Ge layer 320 at least twice via the first waveguide region 3411 and the second waveguide region 3412. Therefore, the responsivity of the photoelectric detector can be improved without increasing the length of the Ge layer 320 and reducing the 3 dB photoelectric bandwidth of the photoelectric detector.

In the embodiment of the disclosure, as shown in FIG. 7, the light splitting waveguide region 343 and the third waveguide region 3413 are respectively located on a third sidewall and a fourth sidewall of the Ge layer 320. The third sidewall and the fourth sidewall are two opposite sidewalls of the Ge layer 320 parallel to the second direction, respectively. The third and fourth sidewalls of the Ge layer 320 are the left and right sidewalls of the Ge layer 320 (in the second direction), respectively. That is, the light splitting waveguide region 343 and the third waveguide region 3413 are located on the left and right sides of the Ge layer 320 (in the second direction), respectively. As shown in FIG. 7, the first waveguide region, the second waveguide region, the third waveguide region, and the light splitting waveguide region 343 enclose a closed area along the transmission direction of the optical signal, and the Ge layer 320 is located in the closed area.

It is to be noted that the light splitting waveguide region 343 is not limited to being located on the side opposite to the third waveguide region 3413, and the position of the light splitting waveguide region 343 may be adjusted according to actual needs.

In the embodiment of the disclosure, the light splitting waveguide region 343 may also split the received optical signal into more than two paths of optical signals. For example, the light splitting waveguide region 343 splits the received optical signal into three paths of optical signals. Two paths of optical signals thereof are respectively output to the first waveguide region 3411 and the second waveguide region 3412, and then the remaining one path of optical signal is output, by the light splitting waveguide region 343, to another waveguide region, such as a waveguide region (not shown in the figure) at the sidewall side of the Ge layer 320 in the second direction.

As shown in FIG. 7, the first waveguide layer 330 further includes an isolation waveguide region 333 located between the first interlayer coupling region 332 and the fourth waveguide region 331. The orthographic projection of the isolation waveguide region 333 on the Si layer is staggered from the orthographic projection of the light splitting waveguide region 343 on the Si layer, so that the optical signal on the first waveguide layer 330 does not generate interlayer coupling with the second waveguide layer 340 when transmitted to a position corresponding to the light splitting waveguide region 343.

In the embodiment of the disclosure, after the interlayer coupling between the first waveguide layer 330 and the second waveguide layer 340 is completed, the optical signal in the first waveguide layer 330 is transmitted to the fourth waveguide region 331 along the isolation waveguide region 333, thereby being staggered with the light splitting waveguide region 343 of the second waveguide layer 340, so as to avoid the interference of the second waveguide layer 340 to the light splitting waveguide region 343.

The distance H between the first interlayer coupling region 332 and the second interlayer coupling region 342 is 50 nm to 1500 nm.

The extension direction of the fourth waveguide region 331 of the first waveguide layer 330 is parallel to a contact plane of the Si layer 310 and the Ge layer 320, and the distance between the fourth waveguide region 331 and an upper surface of the Ge layer 320 is 60 nm to 1000 nm. The distance between the first waveguide region, the second waveguide region or the third waveguide region and the Si layer 310 is 100 nm to 1200 nm.

The distance between the sidewall of the Ge layer 320 and each of the first waveguide region, the second waveguide region or the third waveguide region of the second waveguide layer 340 is 50 nm to 1000 nm.

The area of the cross section of the fourth waveguide region, the first waveguide region, the second waveguide region or the third waveguide region in the direction perpendicular to the input direction of the optical signal is 0.06 $\mu m^2$ to 0.5 $\mu m^2$.

It is to be noted that the cross section of the fourth waveguide region, the first waveguide region, the second waveguide region or the third waveguide region in the direction perpendicular to the transmission direction of the optical signal may be a rectangle or a trapezoid. In the embodiment of the disclosure, explanation is made by taking the cross section of the fourth waveguide region, the first waveguide region, the second waveguide region or the third waveguide region in the direction perpendicular to the transmission direction of the optical signal being a rectangle as an example. In practical application, the cross section of the fourth waveguide region, the first waveguide region, the second waveguide region or third waveguide region in the direction perpendicular to the transmission direction of the optical signal may also be a trapezoid (the length of the bottom edge, close to the Si layer 310, of the trapezoid is larger than the length of the top edge away from the Si layer 310).

It is also to be noted that the cross section of the Ge layer 320 in the direction perpendicular to the transmission direction of the optical signal may be a rectangle or a trapezoid. In the embodiment of the disclosure, explanation is made by taking the cross section of the Ge layer 320 in the direction perpendicular to the transmission direction of the optical signal being a rectangle as an example. In practical application, when the Ge layer 320 is formed, although the target shape (the cross section in the direction perpendicular to the transmission direction of the optical signal) of the Ge layer 320 is a rectangle, the actual shape (the cross section in the direction perpendicular to the transmission direction of the optical signal) of the finally formed Ge layer 320 may be a trapezoid due to the influence of the technology. The length of the bottom edge, close to the Ge layer 310, of the trapezoid is larger than the length of the top edge away from the Si layer 310.

The length of the Ge layer 320 in the first direction is 5 $\mu m$ to 100 $\mu m$. By controlling the length of the Ge layer 320 in the first direction, the length of the coupling region may be controlled.

It is to be noted that the photoelectric detector provided by the embodiment of the disclosure may be provided with following preferred dimensions: the cross section (the cross section shown in FIG. 6) of each of the fourth waveguide region, the first waveguide region, the second waveguide region and the third waveguide region in the direction perpendicular to the input direction of the optical signal is 800 nm in length and 300 nm in width; the cross section (the cross section shown in FIG. 6) of the Ge layer 320 in the direction perpendicular to the input direction of the optical signal is 3 μm in length and 500 nm in width; the length (that is, the length of the coupling region) of the Ge layer 320 in the first direction is 12 μm; the distance between the Si layer 310 and each of the first waveguide region, the second waveguide region and the third waveguide region is 150 nm; the distance between the first waveguide region 3411 and the Ge layer 320 is 100 nm; the distance between the second waveguide region 3412 and the Ge layer 320 is 100 nm; and the distance between the fourth waveguide region 331 and the upper surface of the Ge layer 320 is 100 nm.

The Si layer 310 includes a doped region 311 of a first doping type. The Ge layer 320 includes a doped region 321 of a second doping type. The doped region 311 of the first doping type and the doped region 321 of the second doping type are respectively provided with a first metal electrode 312 and a second metal electrode 322. The first doping type is P-type, and the second doping type is N-type, so as to form a photoelectric detector with a PIN structure. Alternatively, the first doping type is N-type and the second doping type is P-type, so as to form a photoelectric detector with a NIP structure.

In the embodiment of the disclosure, as shown in FIGS. 6 and 7, the doped region 311 of the first doping type is formed on the upper surface of the Si layer 310, and the doped region 321 of the second doping type is formed on the upper surface of the Ge layer 320. It is to be noted that the doped region 313 of the second doping type may also be formed on the upper surface of the Si layer 310, and the doped region 323 of the first doping type may also be formed on the upper surface of the Ge layer 320. FIGS. 6 to 7 only illustrate the case where one doped region 311 of the first doping type and one doped region 313 of the second doping type are formed on the Si layer 310, and one doped region 321 of the second doping type and one doped region 323 of the first doping type are formed on the Ge layer 320. The doped region 311 of the first doping type on the Si layer 310 is provided with a first metal electrode 312, and the doped region 313 of the second doping type on the Si layer 310 is provided with a third metal electrode 314. The doped region 321 of the second doping type on the Ge layer 320 is provided with a second metal electrode 322, and the doped region 323 of the first doping type on the Ge layer 320 is provided with a fourth metal electrode 324. The first doping type may be P-type or N-type. When the first doping type is P-type, the second doping type is N-type, so as to form a photoelectric detector with a PIN structure between the doped region 311 of the first doping type and the doped region 321 of the second doping type, and form a photoelectric detector with a NIP structure between the doped region 313 of the second doping type and the doped region 323 of the first doping type. When the first doping type is N-type, the second doping type is P-type, so as to form a photoelectric detector with a NIP structure between the doped region 311 of the first doping type and the doped region 321 of the second doping type, and form a photoelectric detector with a PIN structure between the doped region 313 of the second doping type and the doped region 323 of the first doping type. It is to be noted that an undoped region between the Si layer 310 and the Ge layer 320 serves as an intrinsic body in the PIN structure or the NIP structure.

In the embodiment of the disclosure, the doped region 321 of the second doping type and the doped region 323 of the first doping type are formed on the upper surface of the Ge layer 320, and the first doping type and the second doping type are different doping types. A lateral built-in electric field (a direction from the doped region 321 of the second doping type to the doped region 323 of the first doping type or a direction from the doped region 323 of the first doping type to the doped region 321 of the second doing type) may be formed between the doped region 321 of the second doping type and the doped region 323 of the first doping type on the Ge layer 320 to generate charge carriers.

In the embodiment of the disclosure, in the case where the Si layer 310 only has one type of doped region, the Si layer 310 may also be a doped Si layer. When the first doping type is P-type, the Si layer 310 may be an overall P-type doped Si layer, but the doping concentration of the doped region is higher than the overall doping concentration of the Si layer 310. When the first doping type is N-type, the Si layer 310 may be an overall N-type doped Si layer, but the doping concentration of the doped region is higher than the overall doping concentration of the Si layer 310. It is to be understood that since the silicon nitride waveguide is used to transmit the optical signal, the adverse effect on optical signal transmission in the case where the doped Si layer serves as the waveguide can be avoided, thereby effectively reducing the loss in the transmission of the optical signal.

In the embodiment of the disclosure, an applied voltage is applied between the first metal electrode 312 on the Si layer 310 and the second metal electrode 324 on the Ge layer 320 and/or an external voltage is applied between the third metal electrode 314 on the Si layer 310 and the fourth metal electrode 324 on the Ge layer 320 so as to form an applied electric field, extracting charge carriers generated in the Ge layer 320. In addition, the electric field direction of the applied electric field is the same as the electric field direction of a built-in electric field formed in the Ge layer 320, so that the applied electric field may accelerate the moving speed of the charge carriers, thereby improving the responsivity of the photoelectric detector.

In the embodiment of the disclosure, as shown in FIG. 7, the length of the metal electrodes (312, 314, 322 and 324) in the first direction is smaller than the length of the Ge layer 320 in the first direction. The upper surfaces of the metal electrodes are exposed to the upper surface of the photoelectric detector.

In the embodiment of the disclosure, the doped region structures of the Ge layer 320 and the Si layer 310 may also be changed so as to implement avalanche gain detection (APD). The specific implementation mode may include that: an avalanche region is additionally arranged on the Ge layer 320, or a reverse bias voltage greater than 6V is applied to the formed NIP structure or PIN structure to implement avalanche gain detection.

Figure 8:
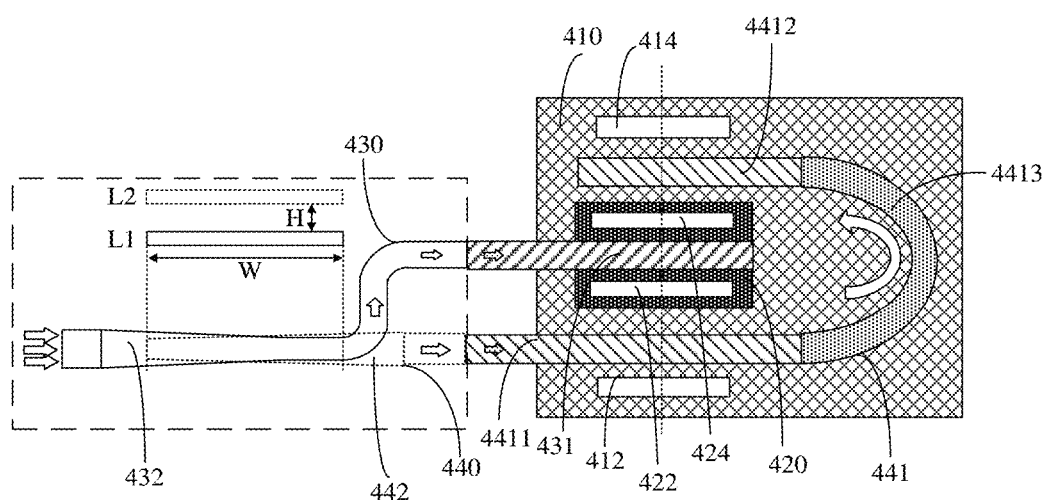
FIG. 8 shows a plan view of another example of a photoelectric detector according to an embodiment of the disclosure.

Another implementation mode of the photoelectric detector is also provided in the disclosure. FIG. 8 is a plan view of another implementation mode of a photoelectric detector according to an embodiment of the disclosure. It is also to be noted that, in order to show the upper-lower layer positional relationship of a first waveguide layer and a second waveguide layer, the structure in a dashed frame of FIG. 8 is not hatched, but the material of the structure in the dashed frame of FIG. 8 shall be understood as the same as the material of other structures. In addition, in order to show the waveguide structure more clearly, the scale of the structure inside and outside the dashed frame in FIG. 8 may be different (for example, the structure inside the dashed frame is enlarged in the transverse direction in the figure), so the size or scale of the structure in the figure shall not be understood as limiting the corresponding features in the disclosure. Herein, L1 represents the first waveguide layer and L2 represents the second waveguide layer. L1 and L2 are only used to illustrate the first waveguide layer and the second waveguide layer, and are not used to limit the shapes and lengths of the first waveguide layer and the second waveguide layer in the disclosure.

As shown in FIG. 8, in the implementation mode, the second waveguide layer 440 may also not employ the light splitting waveguide region 443 to perform light splitting. The second interlayer coupling region 442 may be directly connected to the first waveguide region 4411 and the second waveguide region 4412. The coupled optical signal is transmitted by the second interlayer coupling region 442 to the first waveguide region 4411, and by the first waveguide region 4411, the optical signal is transmitted to the second waveguide region 4412 through the third waveguide region 4413. The optical signal is propagated in a direction from the first waveguide region 4411 to the third waveguide region 4413 to the second waveguide region 4412. In the embodiment of the disclosure, the first waveguide region 4411 and the second waveguide region 4412 are located on two sides of the Ge layer 420, respectively. The first waveguide region 4411 and the second waveguide region 4412 are connected by the third waveguide region 4413, so that the optical signal is coupled with the Ge layer 420 at least twice. Thus, the responsivity of the photoelectric detector can be improved without increasing the length of the Ge layer 420 and reducing the 3 dB photoelectric bandwidth of the photoelectric detector.

It is to be understood that reference throughout this specification to "one embodiment" or "an embodiment" means that particular features, structures, or characteristics described in connection with the embodiment is included in at least one embodiment of the disclosure. Thus, the appearances of the phrases "in the/one embodiment" or "in an embodiment" in various places throughout this specification are not necessarily all referring to the same embodiment. Furthermore, these particular features, structures, or characteristics may be combined in any suitable manner in one or more embodiments. It is further to be understood that the sequence numbers of the foregoing processes do not mean execution sequences in various embodiments of the disclosure. The execution sequences of the processes should be determined according to functions and internal logics of the processes, and should not be construed as any limitation to the implementation processes of the embodiments of the disclosure. The serial numbers of the embodiments of the application are merely for description and do not represent a preference of the embodiments.

The characteristics disclosed in several product embodiments provided in the disclosure may be arbitrarily combined without conflict to obtain a new product embodiment.

The above is only the specific implementation mode of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subjected to the scope of protection of the claims.

The invention claimed is:

1. A photoelectric detector, comprising:
a Silicon (Si) layer comprising a first-doping-type doped region;
a Germanium (Ge) layer being in contact with the Si layer and comprising a second-doping-type doped region; and
a silicon nitride waveguide arranged around the Ge layer in extension directions of at least three sidewalls of the Ge layer;
wherein the silicon nitride waveguide is configured to transmit an optical signal and couple the optical signal to the Ge layer; the Ge layer is configured to detect the optical signal and convert the optical signal into an electrical signal.

2. The photoelectric detector of claim 1, wherein
the silicon nitride waveguide comprises a first waveguide region and a second waveguide region, and
the Ge layer is arranged between the first waveguide region and the second waveguide region.

3. The photoelectric detector of claim 2, wherein
a projection of the sidewall of the Ge layer on the Si layer has a first shape with a length in a first direction larger than a length in a second direction,
wherein the silicon nitride waveguide further comprises a third waveguide region connecting the first waveguide region and the second waveguide region in the second direction.

4. The photoelectric detector of claim 3, wherein the photoelectric detector further comprises:
a light splitting waveguide connected to the silicon nitride waveguide, configured to split the received optical signal into at least two paths of optical signals, and output two paths of optical signals to the first waveguide region and the second waveguide region respectively.

5. The photoelectric detector of claim 3, wherein
the optical signal transmitted by the silicon nitride waveguide is propagated in a direction from the first waveguide region to the third waveguide region to the second waveguide region,
a distance between the first waveguide region and the Ge layer is larger than a distance between the second waveguide region and the Ge layer.

6. The photoelectric detector of claim 4, wherein
the silicon nitride waveguide and the light splitting waveguide enclose a closed area along a transmission direction of the optical signal, and the Ge layer is located in the closed area.

7. The photoelectric detector of claim 3, wherein
the first waveguide region and the second waveguide region are straight waveguide regions, and
the third waveguide region is a bent waveguide region.

8. The photoelectric detector of claim 3, wherein
a length of the Ge layer in the first direction is 5 μm to 100 μm.

9. The photoelectric detector of claim 2, wherein
a distance between the Ge layer and each of the first waveguide region and the second waveguide region is 50 nm to 1000 nm.

10. The photoelectric detector of claim 1, wherein
the silicon nitride waveguide comprises a first waveguide layer and a second waveguide layer, the first waveguide layer comprises a fourth waveguide region arranged above the Ge layer, the second waveguide layer comprises a first waveguide region, a second waveguide region and a third waveguide region arranged on a side face of the Ge layer; and the first waveguide layer and the second waveguide layer respectively coupling the optical signal to the Ge layer through the fourth waveguide region and the first waveguide region, the second waveguide region and the third waveguide region.

11. The photoelectric detector of claim 10, wherein the first waveguide layer further comprises a first interlayer coupling region connected to the fourth waveguide region;

the second waveguide layer further comprises a second interlayer coupling region connected to the first waveguide region and the second waveguide region;

optical signal transmission is implemented between the first waveguide layer and the second waveguide layer through interlayer coupling of the first interlayer coupling region and the second interlayer coupling region; and optical signals of the first interlayer coupling region and the second interlayer coupling region are respectively transmitted to the fourth waveguide region, the first waveguide region, the second waveguide region and the third waveguide region.

12. The photoelectric detector of claim 11, wherein an orthographic projection of the first interlayer coupling region on the Si layer is at least partially overlapped with an orthographic projection of the second interlayer coupling region on the Si layer.

13. The photoelectric detector of claim 11, wherein the second waveguide layer further comprises a light splitting waveguide region located at the second interlayer coupling region and between the first waveguide region and the second waveguide region; and the light splitting waveguide region is configured to split the optical signal transmitted from the second interlayer coupling region into at least two paths, and output two paths of optical signals to the first waveguide region and the second waveguide region respectively.

14. The photoelectric detector of claim 13, wherein the first waveguide layer further comprises an isolation waveguide region located between the first interlayer coupling region and the fourth waveguide region; and an orthographic projection of the isolation waveguide region on the Si layer is staggered from an orthographic projection of the light splitting waveguide region on the Si layer, so that an optical signal of the first waveguide layer does not generate interlayer coupling with the second waveguide layer when transmitted to a position corresponding to the light splitting waveguide region.

15. The photoelectric detector of claim 11, wherein an extension direction of the fourth waveguide region of the first waveguide layer is parallel to a contact plane of the Si layer and the Ge layer; and a distance between the fourth waveguide region and an upper surface of the Ge layer is 60 nm to 1000 nm.

16. The photoelectric detector of claim 11, wherein the first waveguide layer is configured to receive the optical signal, and transmit, in the first interlayer coupling region, the received optical signal to the second interlayer coupling region of the second waveguide layer through interlayer coupling.

17. The photoelectric detector of claim 11, wherein a distance between the first interlayer coupling region and the second interlayer coupling region is 50 nm to 1500 nm; or in a transmission direction of the optical signal, a cross-sectional area of the first interlayer coupling region becomes smaller, while the cross-sectional area of the second interlayer coupling region becomes larger.

18. The photoelectric detector of claim 1, wherein an extension direction of the silicon nitride waveguide is parallel to a contact plane of the Si layer and the Ge layer; and a distance between the silicon nitride waveguide and the Si layer is 100 nm to 1200 nm.

19. The photoelectric detector of claim 1, wherein the doped region of the first doping type and the doped region of the second doping type are respectively provided with a first metal electrode and a second metal electrode, wherein the first doping type is P-type, and the second doping type being N-type, so as to form a photoelectric detector with a PIN structure; or, the first doping type is N-type, and the second doping type is P-type, so as to form a photoelectric detector with a NIP structure.

20. The photoelectric detector of claim 1, wherein a silicon dioxide material is provided between the silicon nitride waveguide and the Ge layer; and a silicon dioxide material is provided between the silicon nitride waveguide and the Si layer.

* * * * *